United States Patent
Oh et al.

(10) Patent No.: US 9,012,915 B2
(45) Date of Patent: Apr. 21, 2015

(54) ORGANIC LIGHT-EMITTING DISPLAY APPARATUS AND METHOD OF MANUFACTURING THE SAME

(75) Inventors: Jae-Hwan Oh, Yongin (KR);
Yeoung-Jin Chang, Yongin (KR);
Seong-Hyun Jin, Yongin (KR);
Won-Kyu Lee, Yongin (KR); Jae-Beom Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 13/546,991

(22) Filed: Jul. 11, 2012

(65) Prior Publication Data

US 2013/0146878 A1 Jun. 13, 2013

(30) Foreign Application Priority Data

Dec. 12, 2011 (KR) .......................... 10-2011-0133055

(51) Int. Cl.
*H01L 33/58* (2010.01)
*H01L 21/00* (2006.01)
*H01L 51/52* (2006.01)
*H01L 27/12* (2006.01)

(52) U.S. Cl.
CPC ......... *H01L 51/5265* (2013.01); *H01L 27/1218* (2013.01); *H01L 27/12* (2013.01); *H01L 27/1214* (2013.01)

(58) Field of Classification Search
CPC ................... H01L 51/5265; H01L 2251/5369; H01L 27/1218; H01L 27/1262; H01L 29/78603; H01L 51/5268; H01L 29/78633
USPC ........... 257/59, 72, E33.062, 98; 438/29, 34, 438/48, 128; 977/773, 950, 890
See application file for complete search history.

(56) References Cited

U.S. PATENT DOCUMENTS

| | | | | |
|---|---|---|---|---|
| 6,137,551 | A * | 10/2000 | Jeong .............................. | 349/38 |
| 8,319,221 | B2 * | 11/2012 | Choi et al. ...................... | 257/59 |
| 2007/0069199 | A1 * | 3/2007 | Choulis et al. .................. | 257/40 |
| 2007/0236623 | A1 | 10/2007 | Heo et al. | |
| 2007/0298160 | A1 * | 12/2007 | Jang et al. ....................... | 427/58 |
| 2008/0142808 | A1 * | 6/2008 | Lee ................................. | 257/72 |
| 2010/0285656 | A1 * | 11/2010 | Esconjauregui et al. ..... | 438/478 |
| 2011/0001139 | A1 | 1/2011 | Kim et al. | |
| 2011/0187629 | A1 * | 8/2011 | Nam et al. ....................... | 345/76 |
| 2012/0138937 | A1 * | 6/2012 | Jo et al. ............................ | 257/59 |

FOREIGN PATENT DOCUMENTS

| KR | 10-2007-0100456 | 10/2007 |
|---|---|---|
| KR | 10-2007-0102301 A | 10/2007 |
| KR | 10-2011-0003201 | 1/2011 |

OTHER PUBLICATIONS

Yang, F.M., et al. *Nickel nanocrystals with HfO₂ blocking oxide for nonvolatile memory application*, Applied Physics Letters 90, 222104 (2007), 2007 American Institute of Physics, 3 pages.

* cited by examiner

*Primary Examiner* — Thinh T Nguyen
(74) *Attorney, Agent, or Firm* — Christie, Parker & Hale, LLP

(57) ABSTRACT

An organic light-emitting display apparatus includes a buffer layer that is on a substrate and includes nanoparticles including nickel (Ni), a pixel electrode on the buffer layer, an organic emission layer on the pixel electrode, and an opposite electrode on the organic emission layer. A method of manufacturing the organic light-emitting display apparatus is provided.

16 Claims, 6 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2011-0133055, filed on Dec. 12, 2011, in the Korean Intellectual Property Office, the disclosure of which is incorporated herein in its entirety by reference.

BACKGROUND

1. Field

Embodiments of the present invention relate to an organic light-emitting display apparatus and a method of manufacturing the same, and more particularly, to an organic light-emitting display apparatus having improved luminous efficiency and a method of manufacturing the same.

2. Description of Related Art

Because organic light-emitting display apparatuses, which are self-emitting display apparatuses, do not include a backlight, the organic light-emitting display apparatuses may be driven at a low voltage, may be made light and thin, and have wide viewing angles and excellent contrast. Accordingly, they have drawn attention as next-generation display apparatuses.

An organic light-emitting display apparatus has a wide emitting wavelength range or spectrum, thereby reducing luminous efficiency and reducing color purity. Because light emitted from an organic emission layer has no directivity, many photons from among photons emitted in a set or predetermined direction do not reach a viewer due to total internal reflection, thereby reducing extraction efficiency of an organic light-emitting device.

Accordingly, a method of increasing color purity and light extraction efficiency by introducing a distributed bragg reflector (DBR) mirror into an organic light-emitting display apparatus has been suggested. However, in the case of a resonance structure using such a DBR mirror, there is a limitation in increasing light extraction efficiency.

SUMMARY

Embodiments of the present invention are directed to an organic light-emitting display apparatus having improved luminous efficiency and a method of manufacturing the organic light-emitting display apparatus.

Embodiments of the present invention are also directed to an organic light-emitting display apparatus including a resonance structure formed by a simple manufacturing method, and a method of manufacturing the organic light-emitting display apparatus.

Embodiments of the present invention are also directed to an organic light-emitting display apparatus that may decrease color shift occurring at a lateral viewing angle.

According to an embodiment of the present invention, there is provided an organic light-emitting display apparatus including: a buffer layer on a substrate, and including nanoparticles including nickel (Ni); a pixel electrode on the buffer layer; an organic emission layer on the pixel electrode; and an opposite electrode on the organic emission layer.

The nanoparticles may further include silicon (Si).

The nanoparticles may include $NiSi_2$.

The buffer layer may include a first buffer layer on the substrate and a second buffer layer on the first buffer layer, and the nanoparticles may be between the first buffer layer and the second buffer layer.

The organic light-emitting display apparatus may further include a transflective metal layer between the first buffer layer and the second buffer layer, wherein the nanoparticles may be between the second buffer layer and the transflective metal layer.

The organic light-emitting display apparatus may further include a thin film transistor including an active layer on the buffer layer spaced apart from the pixel electrode, a first insulating layer on the active layer, a gate electrode on the first insulating layer, a second insulating layer covering the gate electrode, and source and drain electrodes that are electrically connected to the active layer, respectively, with the second insulating layer therebetween, one of the source and drain electrodes being electrically connected to the pixel electrode; and a capacitor including a lower electrode that is at the same layer level as the active layer and is spaced apart from the active layer, and an upper electrode that is insulated from the lower electrode by the first insulating layer and is at the same layer level as the gate electrode.

The first insulating layer may be between the buffer layer and the pixel electrode.

The first insulating layer may include a plurality of layers, in which adjacent layers have different refractive indexes.

According to another embodiment of the present invention, there is provided a method of manufacturing an organic light-emitting display apparatus, the method including: forming a buffer layer on a substrate, the buffer layer including nanoparticles including nickel (Ni); forming a pixel electrode on the buffer layer; forming an organic emission layer on the pixel electrode; and forming an opposite electrode on the organic emission layer.

The nanoparticles may further include silicon (Si).

The nanoparticles may include $NiSi_2$.

The forming of the buffer layer including the nanoparticles may include: forming a first buffer layer on the substrate; forming Ni particles on the first buffer layer; forming a second buffer layer to cover the Ni particles; and forming $NiSi_2$ by thermal annealing.

The method may further include forming a transflective metal layer on the first buffer layer before the forming of the Ni particles.

The forming of the buffer layer including the nanoparticles may include: forming the first buffer layer on the substrate; forming the Ni particles on the first buffer layer; forming $NiSi_2$ nanoparticles by thermal annealing; and forming the second buffer layer to cover the $NiSi_2$ nanoparticles.

The method may further include forming the transflective metal layer on the first buffer layer before the forming of the Ni particles.

The method may further include forming an active layer on the buffer layer and forming a lower electrode spaced apart from the active layer; forming a first insulating layer to cover the active layer and the lower electrode, forming a gate electrode in an area corresponding to the active layer on the first insulating layer, and forming an upper electrode in an area corresponding to the lower electrode; forming a second insulating layer having a first opening for partially exposing the pixel electrode, and second and third openings for partially exposing the active layer on the gate electrode; forming source and drain electrodes, which are respectively connected to the active layer via the second opening and the third opening, on the second insulating layer, wherein one of the source and drain electrodes is connected to the pixel electrode via the first opening; and forming a third insulating layer to cover the source and drain electrodes, wherein the forming of the pixel electrode is performed at the same time as the forming of the gate electrode and the forming of the upper electrode.

The first insulating layer may be formed between the buffer layer and the pixel electrode.

The first insulating layer may include a plurality of layers, in which adjacent layers have different refractive indexes.

BRIEF DESCRIPTION OF THE DRAWINGS

The above and other features and aspects of the embodiments will become more apparent by describing in detail exemplary embodiments thereof with reference to the attached drawings in which.

DETAILED DESCRIPTION

Hereinafter, exemplary embodiments according to the present invention will be described in detail with reference to the accompanying drawings. Expressions such as "at least one of," when preceding a list of elements, modify the entire list of elements and do not modify the individual elements of the list.

Figure 1:
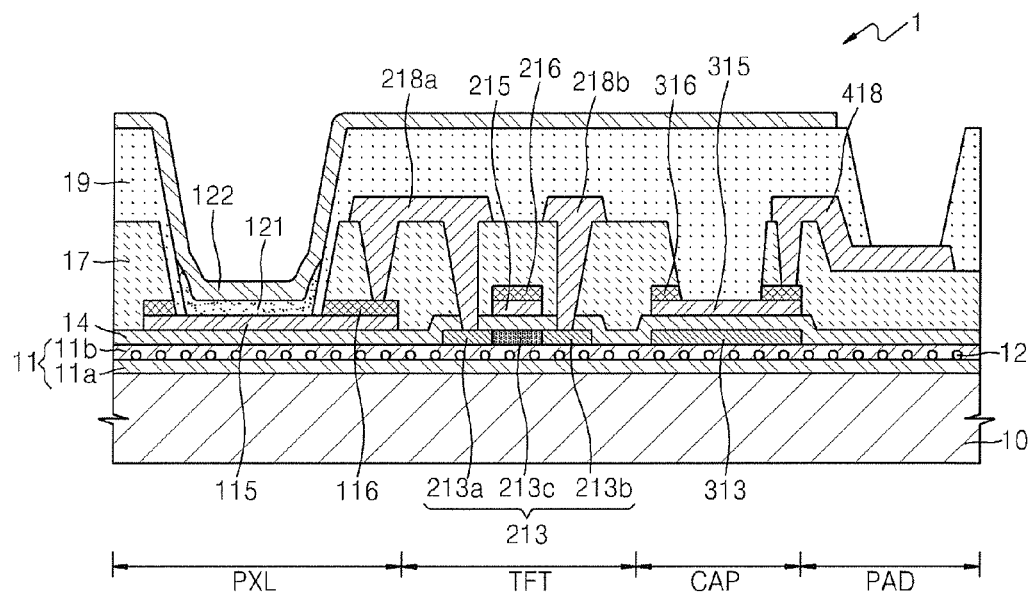
FIG. 1 illustrates a schematic cross-sectional view of an organic light-emitting display apparatus according to an embodiment.

FIG. 1 illustrates a schematic cross-sectional view of an organic light-emitting display apparatus 1 according to an embodiment.

Referring to FIG. 1, the organic light-emitting display apparatus 1 includes a substrate 10, and on an entire surface of the substrate 10, a buffer layer 11 that includes nanoparticles 12 including, e.g., nickel (Ni).

The substrate 10 may be formed of a $SiO_2$-based transparent glass material. However, the present invention is not limited thereto, and the substrate 10 may be formed of any of various suitable materials, for example, a transparent plastic material. The substrate 10 is formed of a transparent material through which light may pass through, and light produced by an organic emission layer 121 passes through the substrate 10 to be emitted to the outside.

The buffer layer 11 disposed on the substrate 10 includes a first buffer layer 11a and a second buffer layer 11b, and the nanoparticles 12 are disposed between the first buffer layer 11a and the second buffer layer 11b.

The buffer layer 11 may reduce or prevent impurities from penetrating the substrate 10 and may planarize a surface of the substrate 10. The buffer layer 11 may be formed of $SiN_x$, $SiO_2$, $TiO_2$, $HfO_2$, $Al_2O_3$, $SiO_x$, $Ta_2O_5$, $Nb_2O_5$, $ZrO_2$, $Y_2O_3$, $La_2O_3$, or AZO, and the first buffer layer 11a and the second buffer layer 11b may be formed of the same material or different materials. However, at least one of the first buffer layer 11a and the second buffer layer 11b may include a material including silicon (Si), for example, at least one of $SiO_2$, $SiN_x$, and $SiO_x$.

The nanoparticles 12 include Ni and Si, and may be $NiSi_2$. The $NiSi_2$ may be formed by coupling Ni particles and Si particles included in the buffer layer 11. For example, Ni and Si may be naturally coupled to each other by thermal annealing.

In the organic light-emitting display apparatus 1 of the current embodiment, the nanoparticles 12 serve as a semi-permeable film, and the nanoparticles 12 and an opposite electrode 122 formed as a reflective electrode may together form a resonance structure to improve light extraction efficiency of the organic light-emitting display apparatus 1. Also, the nanoparticles 12 may be formed through a process that is different from a process for forming a pixel electrode 115, thereby preventing or reducing damage to the nanoparticles 12 due to etching of the pixel electrode 115. Accordingly, damage to the resonance structure of the organic light-emitting display apparatus 1 may be prevented during a manufacturing method.

In this embodiment, the nanoparticles 12 may be formed only in a pixel area PXL or may be formed on an entire surface of the first buffer layer 11a.

The organic light-emitting display apparatus 1 of the current embodiment includes the pixel area PXL, a thin film transistor area TFT, a capacitor area CAP, and a pad area PAD.

The pixel electrode 115, the organic emission layer 121, and the opposite electrode 122 are sequentially disposed on the pixel area PXL of the substrate 10, and the buffer layer 11 and a first insulating layer 14 are disposed between the substrate 10 and the pixel electrode 115.

The pixel electrode 115 may be formed of a transparent material or a translucent conductive material. The transparent/translucent conductive material may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A first metal layer 116 may be additionally disposed on an edge portion of the pixel electrode 115, and a third insulating layer 19 is disposed to cover the first metal layer 116 and a part of the pixel electrode 115 to thus define a light-emitting area. That is, the third insulating layer 19 serves as a pixel-defining layer and may be formed of an organic material or an inorganic material.

The organic emission layer 121 may be a low or high molecular weight organic material. When the organic emission layer 121 is a low molecular weight organic material, a hole transport layer (HTL), a hole injection layer (HIL), an electron transport layer (ETL), and an electron injection layer (EIL) may be stacked around the organic emission layer 121, or alternatively, various other layers may be stacked around the organic emission layer 121 if desired. For example, the HTL and HIL may be stacked on one side of the organic emission layer 121, and the ETL and EIL may be stacked on another side of the organic emission layer 121. In this regard, examples of suitable materials of the organic emission layer 121 may include copper phthalocyanine (CuPc), N,N'-di(naphthalene-1-yl)-N,N'-diphenyl-benzidine (NPB), tris(8-hydroxyquinoline) aluminum ($Alq_3$), and the like. On the other hand, when the organic emission layer 121 is a high molecular weight organic material. The HTL may further be included, in addition to the organic emission layer 121. The HTL may be formed of poly(3,4)-ethylenedioxythiophene (PEDOT), polyaniline (PANI), or the like. In this regard, examples of suitable materials of the organic emission layer 121 may include a polyphenylene vinylene (PPV)-based high molecular weight organic material and a polyfluorene-based high molecular weight organic material, and the like.

The opposite electrode 122 may be formed as a reflective electrode. In the current embodiment, the pixel electrode 115 serves as an anode, and the opposite electrode 122 serves as a cathode. Alternatively, according to some embodiments, the pixel electrode 115 may serve as a cathode and the opposite electrode 122 may serve as an anode. The opposite electrode 122 may include at least one selected from Ag, Al, Mg, Li, Ca, LiF/Ca, and LiF/Al.

As the opposite electrode 122 is formed as a reflective electrode, light emitted from the organic emission layer 121 is reflected by the opposite electrode 122, passes through the pixel electrode 115 formed of a transparent/translucent conductive material, and is emitted to the substrate 10.

Also, the opposite electrode 122 and the nanoparticles 12, which are disposed between the first buffer layer 11a and the second buffer layer 11b, may together form a resonance structure of a mirror. In other words, the nanoparticles 12 serve as a transflective mirror and the opposite electrode 122 serves as a reflective electrode, and thus resonance may occur between the opposite electrode 122 and the nanoparticles 12.

Figure 12:
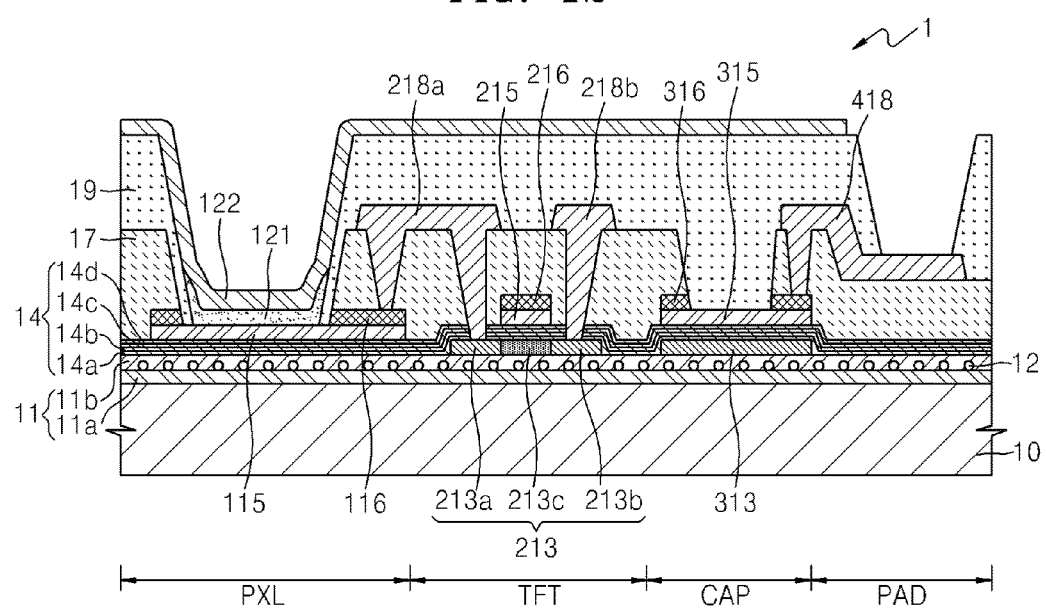
FIG. 12 illustrates a schematic cross-sectional view of an organic light-emitting display apparatus according to an embodiment.

The first insulating layer 14 disposed between the buffer layer 11 and the pixel electrode 115 may be formed of $SiN_x$, $SiO_2$, $TiO_2$, $HfO_2$, $Al_2O_3$, $SiO_x$, $Ta_2O_5$, $Nb_2O_5$, $ZrO_2$, $Y_2O_3$, $La_2O_3$, AZO, or the like, and may include a plurality of layers, wherein adjacent layers have different refractive indexes. FIG. 12 illustrates a schematic cross-sectional view of an organic light-emitting display apparatus according to an embodiment. Referring to FIG. 12, the first insulating layer 14 may include a plurality of layers 14a, 14b, 14c, and 14d, and adjacent layers may have different refractive indexes.

The first insulating layer 14 including a plurality of layers may form a distributed bragg reflector (DBR) resonance structure. The organic light-emitting display apparatus 1 of the current embodiment includes both a DBR resonance structure and a resonance structure that is formed as a mirror and includes the nanoparticles 12 and the opposite electrode 122, thereby further improving color purity and light extraction efficiency.

A thin film transistor Tr including an active layer 213, first and second gate electrodes 215 and 216, and source and drain electrodes 218a and 218b, is disposed on the thin film transistor area TFT of the substrate 10.

The active layer 213 may be formed of a semiconductor material, such as amorphous silicon or poly silicon, and may include a channel area 213c and source and drain areas 213a and 213b that are disposed at both sides of the channel area 213c. The source and drain areas 213a and 213b are doped with ion impurities.

The first and second gate electrodes 215 and 216 are disposed on the active layer 213 with the first insulating layer 14 between the active layer 213 and the first gate electrode 215. The first insulating layer 14 serves as a gate insulating layer for insulating the first gate electrode 215 from the active layer 213, which is part of the thin film transistor Tr.

The first gate electrode 215 and the second gate electrode 216 may be formed of conductive materials having different etching selectivities. For example, the first gate electrode 215 may be formed of a transparent conductive material, such as ITO, IZO, ZnO, or $In_2O_3$, and the second gate electrode 216 includes at least one metal material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may be configured as a single layer or multiple layers.

A second insulating layer 17 is disposed on the second gate electrode 216 and between the source and drain electrodes 218a and 218b, which contact the source and drain areas 213a and 213b of the active layer 213, respectively. The second insulating layer 17 serves as an insulating interlayer of the thin film transistor Tr, and the source and drain electrodes 218a and 218b each include at least one metal material selected from Al, Pt, Pd, Ag, Mg, Au, Ni, Nd, Ir, Cr, Li, Ca, Mo, Ti, W, and Cu and may be configured as a single layer or multiple layers. In this regard, the pixel electrode 115 is electrically connected to one of the source and drain electrodes 218a and 218b. In the current embodiment, one of the source and drain electrodes 218a and 218b contacts the first metal layer 116 disposed on the edge portion of the pixel electrode 115 and is electrically connected to the pixel electrode 115 via the first metal layer 116.

The third insulating layer 19 is disposed on the second insulating layer 17 so as to cover the source and drain electrodes 218a and 218b.

A capacitor Cst including a lower electrode 313 and an upper electrode 315, is disposed on the capacitor area CAP of the substrate 10.

The lower electrode 313 may be formed of the same material as the active layer 213 of the thin film transistor Tr, and the upper electrode 315 may be formed of the same material as the pixel electrode 115. The first insulating layer 14 disposed between the lower electrode 313 and the upper electrode 315 serves as a dielectric layer of the capacitor.

A pad electrode 418, which is a connecting terminal for an external driver (not shown), is disposed on the pad area PAD of the substrate 10. The pad electrode 418 may be formed of the same material as the source and drain electrodes 218a and 218b. The pad electrode 418 is disposed on the second insulating layer 17, and no other component is disposed on the pad electrode 418 except for the third insulating layer 19.

FIGS. 2 through 9 sequentially illustrate cross-sectional views of stages in a method of manufacturing the organic light-emitting display apparatus 1, according to an embodiment.

Figure 2:
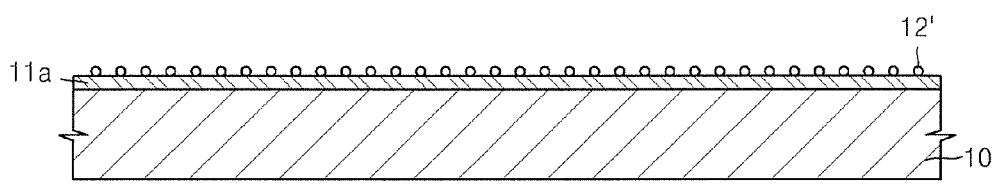
FIGS. 2 through 9 sequentially illustrate cross-sectional views of stages in a method of manufacturing an organic light-emitting display apparatus, according to an embodiment.

Referring to FIG. 2, the first buffer layer 11a is formed on the substrate 10, Ni particles 12' are formed on the first buffer layer 11a. The substrate 10 may be formed of a transparent glass or a plastic material, such as $SiO_2$, and the first buffer layer 11a may be formed of $SiO_2$, $SiN_x$, or the like.

The Ni particles 12' may be formed on the first buffer layer 11a by, e.g., deposition. However, the present invention is not limited thereto, and a nano-scaled thin film formed of Ni may be formed on the first buffer layer 11a.

Figure 3:
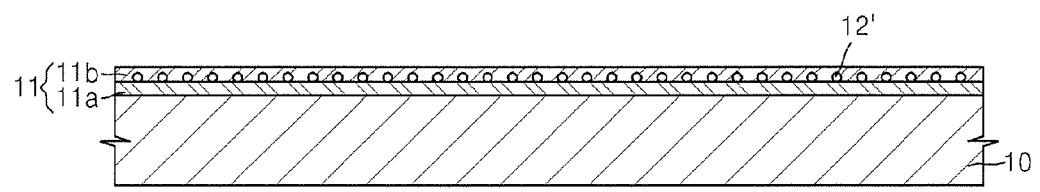
Figure 4:
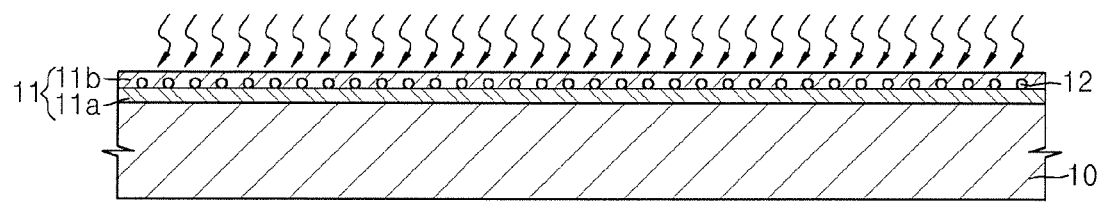

Referring to FIGS. 3 and 4, the second buffer layer 11b is formed to cover the Ni particles 12', and then a thermal annealing process is performed on the second buffer layer 11b.

The Ni particles 12' and Si included in the buffer layer 11 are naturally coupled to each other by the thermal annealing process to thus form the nanoparticles 12 including $NiSi_2$.

In the current embodiment, a method of forming the nanoparticles 12, including $NiSi_2$, after forming the second buffer layer 11b has been described, but the present invention is not limited thereto. For example, in another embodiment, after the Ni particles 12' are formed on the first buffer layer 11a, the nanoparticles 12 including $NiSi_2$ are formed, and then the second buffer layer 11b may be formed to cover the nanoparticles 12.

Figure 5:
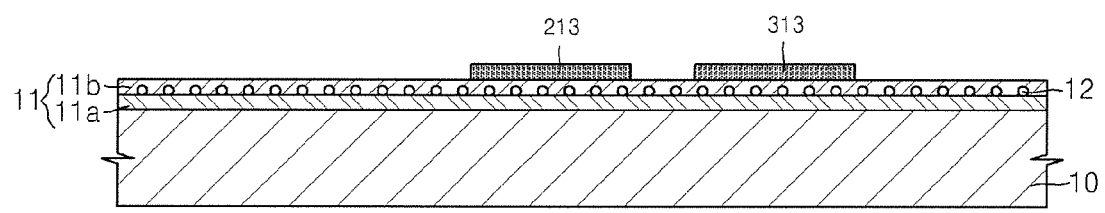

Referring to FIG. 5, the active layer 213, which is part of the thin film transistor Tr, and the lower electrode 313 of a capacitor are formed on the buffer layer 11. The active layer 213 and the lower electrode 313 may be formed by forming a semiconductor layer on an entire surface of the buffer layer 11 and patterning the semiconductor layer.

The semiconductor layer may be formed of amorphous silicon or polysilicon. The semiconductor layer may be deposited on the buffer layer 11 by any of various suitable deposition methods, for example, a plasma-enhanced chemical vapor deposition (PECVD) method, an atmospheric pressure CVD (APCVD) method, or a low pressure CVD method.

The active layer 213 and the lower electrode 313 may be formed by patterning a semiconductor layer by photolithography using a first mask (not shown), and a first mask process may be performed by exposing the first mask (not shown) by using an exposing device (not shown) and then performing a series of processes, for example, developing, etching, stripping, ashing, and the like. Hereinafter, a repeated description of the above-described first mask process is omitted.

Figure 6:
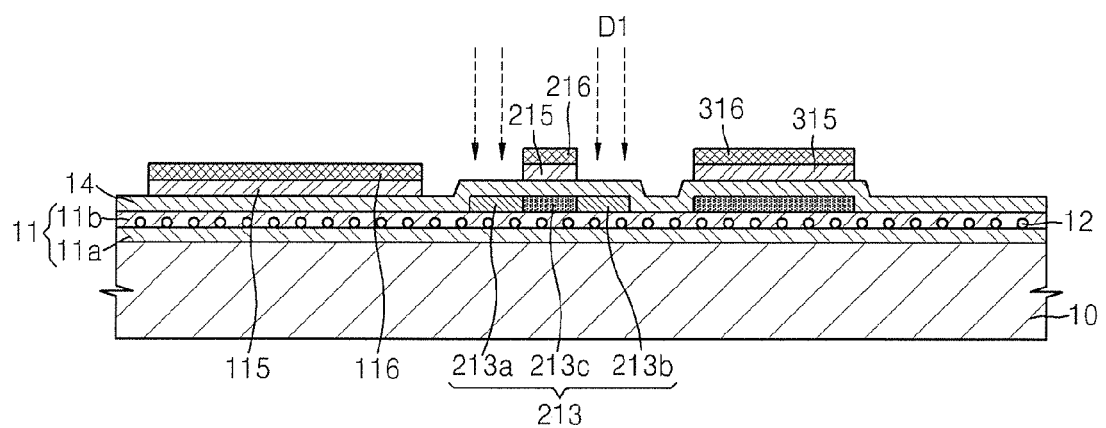

Referring to FIG. 6, the first insulating layer 14 is formed on the resultant structure of FIG. 5, and then the pixel electrode 115 and the first metal layer 116 are formed on the first insulating layer 14 in the pixel area PXL through a second mask process. In addition, the first gate electrode 215 and the second gate electrode 216 are formed in the thin film transistor area TFT, and the upper electrode 315 and a second metal layer 316 are formed in the capacitor area CAP.

The active layer 213 is doped with ion impurities (D1) by using the first and second gate electrodes 215 and 216 formed on the first insulating layer 14, as a self-align mask, to form the source and drain areas 213a and 213b that are doped with the ion impurities, and the channel area 213c that is not doped with the ion impurities.

In this embodiment, the first gate electrode 215 and the second gate electrode 216 may be formed of conductive materials having different etching selectivities. For example, the first gate electrode 215 includes at least one metal material selected from Al, Pt, Pd, Ag, Mg, Au, Ni, Nd, Ir, Cr, Li, Ca, Mo, Ti, W, and Cu and may be configured as a single layer or multiple layers.

The pixel electrode 115 and the upper electrode 315 may be formed of the same material and at the same layer level as the first gate electrode 215, and the first and second metal layers 116 and 316 may be formed of the same material and at the same layer level as the second gate electrode 216.

Figure 7:
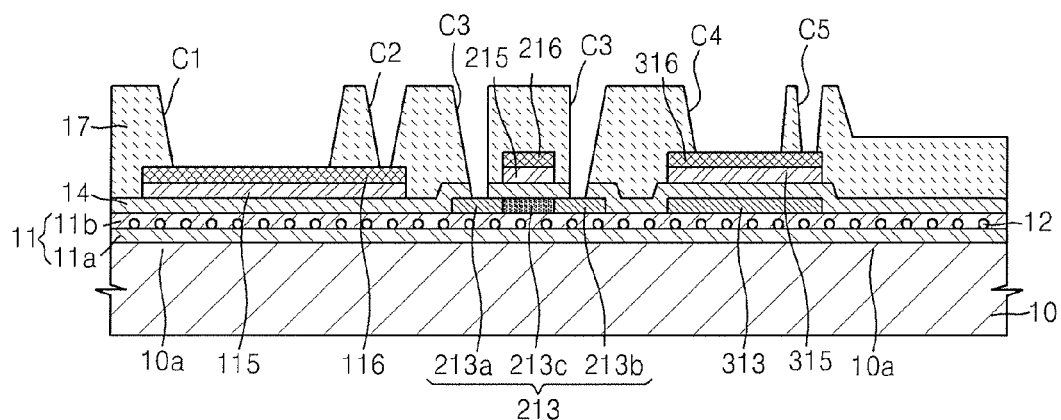

Referring to FIG. 7, the second insulating layer 17 is formed on the resultant structure of FIG. 6, and through a third mask process, a first opening C1 for partially exposing the first metal layer 116, a second opening C2 for electrically connecting the first metal layer 116 to one of the source and drain electrodes 218a and 218b (e.g., shown in FIG. 1), third openings C3 for respectively connecting the source and drain areas 213a and 213b of the active layer 213 to the source and drain electrodes 218a and 218b, a fourth opening C4 for partially exposing the second metal layer 316 of the capacitor Cst, and a fifth opening C5 for connecting the pad electrode 418 (e.g., shown in FIG. 1) to the second metal layer 316 are formed in the second insulating layer 17.

Figure 8:
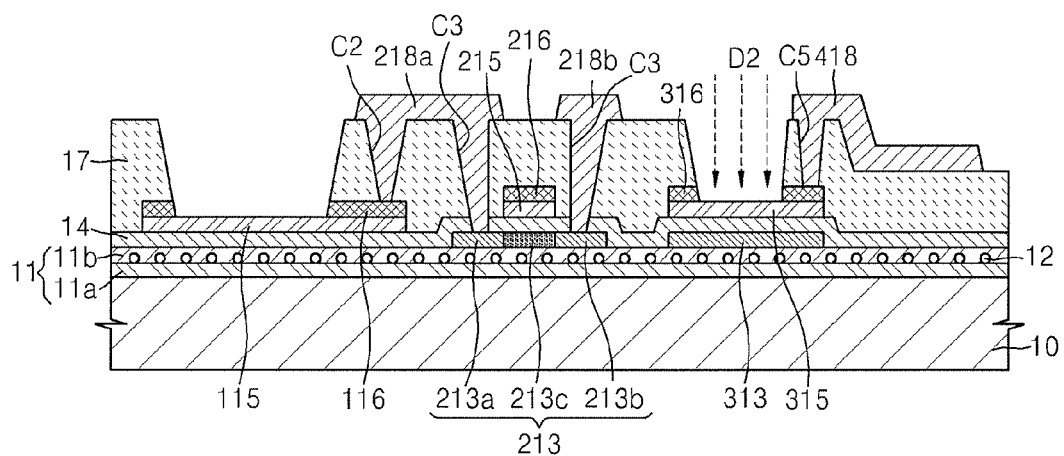

Referring to FIG. 8, the source and drain electrodes 218a and 218b and the pad electrode 418 are formed on the resultant structure of FIG. 7 through a fourth mask process.

In a patterning process of forming the source and drain electrodes 218a and 218b, the first metal layer 116 and the second metal layer 316 are etched together with the source and drain electrodes 218a and 218b to partially expose the pixel electrode 115 and the upper electrode 315.

The source and drain electrodes 218a and 218b are connected to the source and drain areas 213a and 213b of the active layer 213 via the third openings C3, respectively, and one of the source and drain electrodes 218a and 218b is electrically connected to the pixel electrode 115 via the first metal layer 116 that is in contact with the pixel electrode 115 through the second opening C2.

The pad electrode 418 is disposed on the pad area PAD of the substrate 10, which is an edge area of the organic light-emitting display apparatus 1, to serve as a connecting terminal for an external driver (not shown). The pad electrode 418 is electrically connected to the upper electrode 315 via the second metal layer 316 through the fifth opening C5.

After performing the fourth mask process, the lower electrode 313 of the capacitor is doped with ion impurities (D2). The ion impurities (D2) may be B or P ions and doped at an appropriate concentration to a target of the lower electrode 313 of the capacitor.

Figure 9:
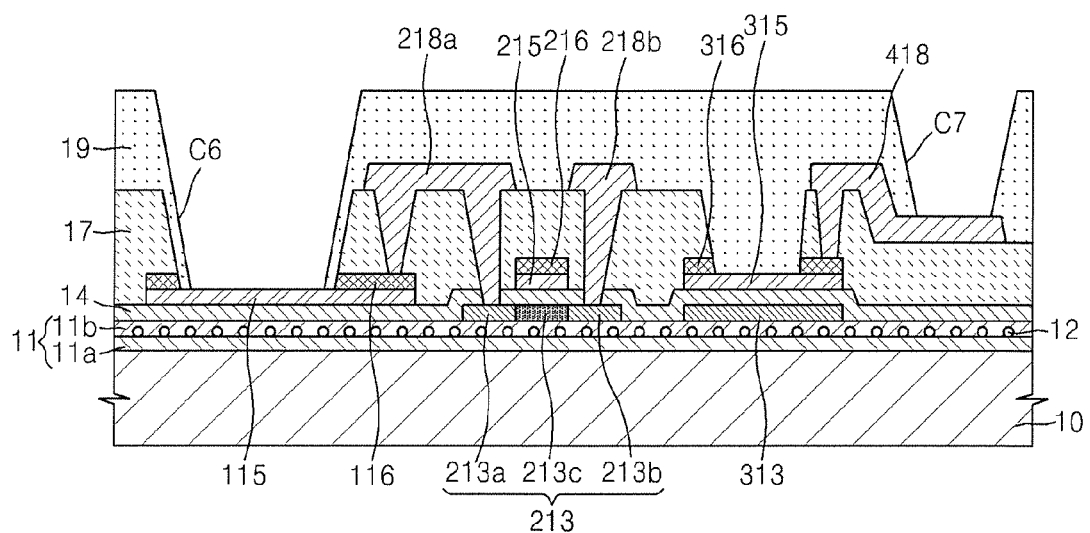

Referring to FIG. 9, the third insulating layer 19 is formed on the resultant structure of FIG. 8, and then a sixth opening C6 for partially exposing the pixel electrode 115 and a seventh opening C7 for partially exposing the pad electrode 418 are formed in the third insulating layer 19 through a fifth mask process.

The third insulating layer 19 with the sixth opening C6 for partially exposing the pixel electrode 115 serves as a pixel-defining layer for defining the light-emitting area.

Referring back to FIG. 1, the organic emission layer 121 and the opposite electrode 122 are formed on the sixth opening C6 on the resultant structure of FIG. 9, thereby completing the manufacture of the organic light-emitting display apparatus 1. In the present embodiment, the opposite electrode 122 may be formed on an entire surface of the substrate 10, except on the pad electrode 418, and may serve as a common electrode.

The organic light-emitting display apparatus 1 of the current embodiment is configured with a resonance structure including the nanoparticles 12 including Ni, and an additional mask process to form the resonance structure is not performed. That is, since an additional mask process is not performed, a manufacturing cost may be reduced.

Figure 10:
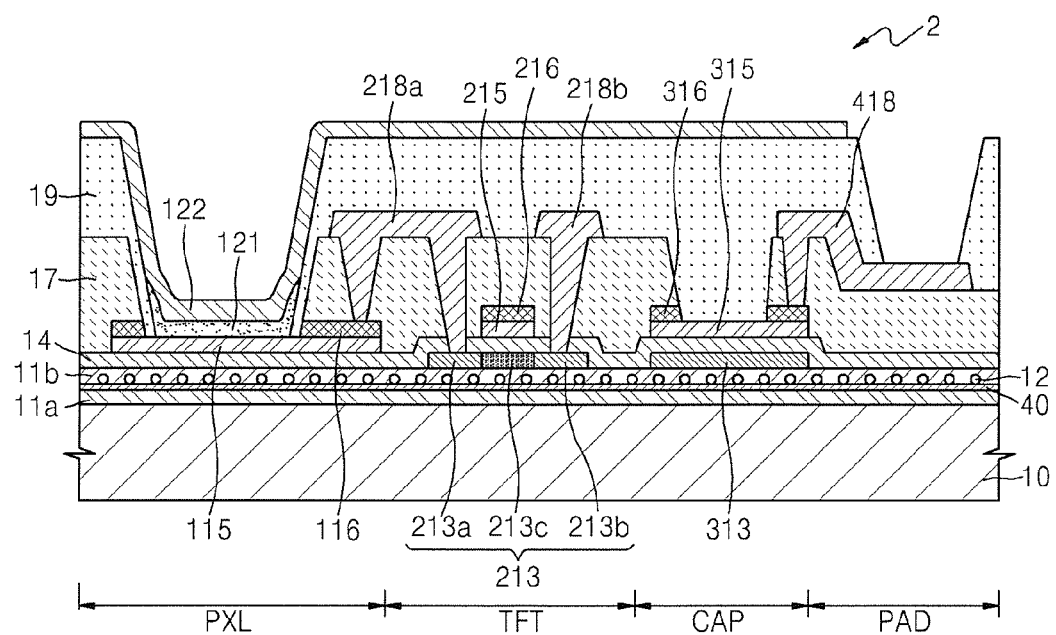
FIG. 10 illustrates a schematic cross-sectional view of an organic light-emitting display apparatus according to another embodiment.

FIG. 10 illustrates a schematic cross-sectional view of an organic light-emitting display apparatus 2 according to another embodiment.

Referring to FIG. 10, most components of the organic light-emitting display apparatus 2 of the current embodiment are the same as those of the organic light-emitting display apparatus 1 of FIG. 1, except for a transflective metal layer 40 disposed between the first buffer layer 11a and the second buffer layer 11b.

The transflective metal layer 40 may be formed of at least one metal selected from Al, Pt, Pd, Ag, Mg, Au, Ni, Nd, Ir, Cr, Li, Ca, Mo, Ti, W, and Cu.

The transflective metal layer 40 is formed to have a thickness equal to or less than about 30 nm according to an embodiment so that light may partially pass through the transflective metal layer 40. The nanoparticles 12 including Ni are disposed on the transflective metal layer 40.

The transflective metal layer 40, the nanoparticles 12, and the opposite electrode 122, which is formed as a reflective electrode, may together form an external resonance structure. While a resonance structure may be formed only by the transflective metal layer 40 and the opposite electrode 122, color shift may occur at a lateral viewing angle due to a difference in a path of light emitted from the organic emission layer 121.

However, in the organic light-emitting display apparatus 2 of the current embodiment, the nanoparticles 12 are disposed on the transflective metal layer 40 to diffuse light, thereby decreasing color shift occurring at a lateral viewing angle.

Figure 11:
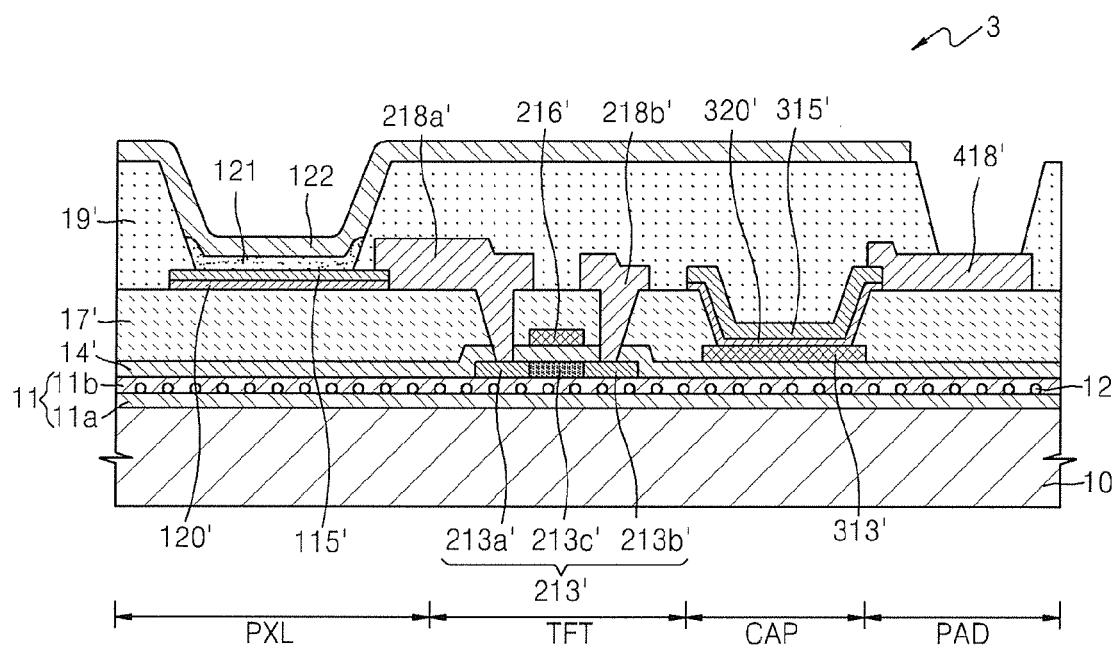
FIG. 11 illustrates a schematic cross-sectional view of an organic light-emitting display apparatus according to another embodiment.

FIG. 11 illustrates a schematic cross-sectional view of an organic light-emitting display apparatus 3 according to another embodiment.

Referring to FIG. 11, most components of the organic light-emitting display apparatus 3 of the current embodiment are the same as those of the organic light-emitting display apparatus 1 of FIG. 1, except for components disposed on the buffer layer 11 and the arrangement of the components.

The organic light-emitting display apparatus 3 of the current embodiment includes the substrate 10, the first buffer layer 11a, the second buffer layer 11b, and the nanoparticles 12 including Ni and disposed between the first buffer layer 11a and the second buffer layer 11b.

A pixel electrode 115', an organic emission layer 121, and an opposite electrode 122 are disposed in the pixel area PXL of the substrate 10, and a first insulating layer 14', a second insulating layer 17', and a fourth insulating layer 120' are disposed between the pixel electrode 115' and the buffer layer 11.

An active layer 213', a gate electrode 216', and source and drain electrodes 218a' and 218b' are disposed in the thin film transistor area TFT of the substrate 10. The first insulating layer 14' is disposed between the active layer 213' and the gate electrode 216', and the second insulating layer 17' is disposed between the gate electrode 216' and the source and drain electrodes 218a' and 218b'.

A lower electrode 313' is formed in the capacitor area CAP of the substrate 10, wherein the lower electrode 313' is formed of the same material and at the same layer level as the gate electrode 216'. An upper electrode 315' is formed of the same material and at the same layer level as the pixel electrode 115'. A dielectric layer 320' between the lower electrode 313' and the upper electrode 315' is formed of the same material and at the same layer level as the fourth insulating layer 120'.

A pad electrode 418' is formed at the pad area PAD of the substrate 10, wherein the pad electrode 418' is formed of the same material and at the same layer level as the source and drain electrodes 218a' and 218b'. The first insulating layer 14' and the second insulating layer 17' are disposed between the buffer layer 11 and the pad electrode 418'.

The organic light-emitting display apparatus 3 of the current embodiment may be formed through six mask processes, and because the dielectric layer 320' of a capacitor and the first insulating layer 14' serving as a gate insulating layer of a thin film transistor are formed as separate insulating layers, the insulating layers may be designed suitably for characteristics of the thin film transistor and the capacitor, respectively.

In the above-described embodiments, the organic light-emitting display apparatuses 1, 2, and 3 formed through five or six mask processes have been described. However, the present invention is not limited thereto, and the organic light-emitting display apparatus may be configured in various suitable ways.

In the organic light-emitting display apparatuses 1, 2, and 3 of the above-described embodiments, the buffer layer 11 includes the nanoparticles 12 serving as a transflective layer, and thus, the nanoparticles 12 and the opposite electrode 122 together form an external resonance structure. Also, the nanoparticles 12 may diffuse light, and thus, color shift that may occur at a lateral viewing angle in a resonance structure may be decreased.

Also, when Ni particles are used, $NiSi_2$ nanoparticles may be formed by thermal annealing, and thus, the resonance structure may be formed through a simple manufacturing method.

In addition, the first insulating layers 14 and 14' are formed on the buffer layer 11 and configured as a multi-layer structure, thereby forming a DBR resonance structure. That is, the organic light-emitting display apparatuses 1, 2, and 3 of the above-described embodiments include both an external resonance structure and a DBR resonance structure, thereby further improving light extraction efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display apparatus comprising:
    a buffer layer on a substrate, and comprising nanoparticles comprising nickel (Ni) and silicon (Si);
    a pixel electrode on the buffer layer;
    an organic emission layer on the pixel electrode; and
    an opposite electrode on the organic emission layer.

2. The organic light-emitting display apparatus of claim 1, wherein the nanoparticles comprise $NiSi_2$.

3. The organic light-emitting display apparatus of claim 1, wherein the buffer layer comprises a first buffer layer on the substrate and a second buffer layer on the first buffer layer, and the nanoparticles are between the first buffer layer and the second buffer layer.

4. The organic light-emitting display apparatus of claim 3, further comprising a transflective metal layer between the first buffer layer and the second buffer layer, wherein the nanoparticles are between the second buffer layer and the transflective metal layer.

5. The organic light-emitting display apparatus of claim 1, further comprising:
    a thin film transistor comprising an active layer on the buffer layer and spaced apart from the pixel electrode, a first insulating layer on the active layer, a gate electrode on the first insulating layer, a second insulating layer covering the gate electrode, and source and drain electrodes that are electrically connected to the active layer, respectively, with the second insulating layer therebetween, one of the source and drain electrodes being electrically connected to the pixel electrode; and
    a capacitor comprising a lower electrode that is at the same layer level as the active layer and is spaced apart from the active layer, and an upper electrode that is insulated from the lower electrode by the first insulating layer and is at the same layer level as the gate electrode.

6. The organic light-emitting display apparatus of claim 5, wherein the first insulating layer is between the buffer layer and the pixel electrode.

7. The organic light-emitting display apparatus of claim 6, wherein the first insulating layer comprises a plurality of layers, in which adjacent layers have different refractive indexes.

8. A method of manufacturing an organic light-emitting display apparatus, the method comprising:
    forming a buffer layer on a substrate, the buffer layer comprising nanoparticles comprising nickel (Ni) and silicon (Si);
    forming a pixel electrode on the buffer layer;
    forming an organic emission layer on the pixel electrode; and
    forming an opposite electrode on the organic emission layer.

9. The method of claim 8, wherein the nanoparticles comprise $NiSi_2$.

10. The method of claim 8, wherein the forming of the buffer layer comprising the nanoparticles comprises:
- forming a first buffer layer on the substrate;
- forming Ni particles on the first buffer layer;
- forming a second buffer layer to cover the Ni particles; and
- forming $NiSi_2$ by thermal annealing.

11. The method of claim 10, further comprising forming a transflective metal layer on the first buffer layer before the forming of the Ni particles.

12. The method of claim 8, wherein the forming of the buffer layer comprising the nanoparticles comprises:
- forming a first buffer layer on the substrate;
- forming Ni particles on the first buffer layer;
- forming $NiSi_2$ nanoparticles by thermal annealing; and
- forming a second buffer layer to cover the $NiSi_2$ nanoparticles.

13. The method of claim 12, further comprising forming the transflective metal layer on the first buffer layer before the forming of the Ni particles.

14. The method of claim 8, further comprising:
- forming an active layer on the buffer layer and forming a lower electrode spaced apart from the active layer;
- forming a first insulating layer to cover the active layer and the lower electrode, forming a gate electrode in an area corresponding to the active layer on the first insulating layer, and forming an upper electrode in an area corresponding to the lower electrode;
- forming a second insulating layer having a first opening for partially exposing the pixel electrode, and second and third openings for partially exposing the active layer on the gate electrode;
- forming source and drain electrodes, which are respectively connected to the active layer via the second opening and the third opening, on the second insulating layer, wherein one of the source and drain electrodes is connected to the pixel electrode via the first opening; and
- forming a third insulating layer to cover the source and drain electrodes,
- wherein the forming of the pixel electrode is performed at the same time as the forming of the gate electrode and the forming of the upper electrode.

15. The method of claim 14, wherein the first insulating layer is formed between the buffer layer and the pixel electrode.

16. The method of claim 15, wherein the first insulating layer comprises a plurality of layers, in which adjacent layers have different refractive indexes.

* * * * *